United States Patent
Henkel et al.

(10) Patent No.: US 8,742,762 B2
(45) Date of Patent: Jun. 3, 2014

(54) ACCUMULATOR CONTROL DEVICE AND METHOD AND SYSTEM FOR AUXILIARY ELECTRICAL POWER SUPPLY

(75) Inventors: Hartmut Henkel, Blomberg (DE);
Michael Heinemann, Lage (DE);
Andreas Neuendorf, Steinheim (DE);
Mike Wattenberg, Leopoldshoehe (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 380 days.

(21) Appl. No.: 13/271,376

(22) Filed: Oct. 12, 2011

(65) Prior Publication Data
US 2012/0112706 A1 May 10, 2012

(30) Foreign Application Priority Data
Oct. 13, 2010 (DE) .......... 10 2010 048 188

(51) Int. Cl.
| G01N 27/416 | (2006.01) |
| G01R 31/08 | (2006.01) |
| H02J 7/04 | (2006.01) |
| G01R 31/36 | (2006.01) |
| H01M 10/46 | (2006.01) |
| H01M 10/48 | (2006.01) |
| H01M 10/44 | (2006.01) |
| H02J 7/00 | (2006.01) |

(52) U.S. Cl.
CPC ........ *G01R 31/3662* (2013.01); *G01R 31/3606* (2013.01); *G01R 31/3658* (2013.01); *G01R 31/3696* (2013.01); *G01R 31/36* (2013.01); *H01M 10/46* (2013.01); *H01M 10/48* (2013.01); *H01M 10/486* (2013.01); *H01M 10/443* (2013.01); *H02J 7/0091* (2013.01); *H02J 7/0086* (2013.01)

USPC .......... 324/426; 324/427; 324/429; 324/430; 324/522; 324/525; 320/150; 320/152

(58) Field of Classification Search
CPC ............... G01R 31/36; G01R 31/3662; G01R 31/3606; G01R 31/3658; G01R 31/3696; H01M 10/46; H01M 10/48; H01M 10/486; H01M 10/443; H02J 7/0091; H02J 7/0086
USPC .......... 320/150, 152, 162; 324/426, 427, 429, 324/430, 522, 525

See application file for complete search history.

(56) References Cited

U.S. PATENT DOCUMENTS

| 6,359,417 B1 | 3/2002 | Winkler |
| 7,692,401 B2 * | 4/2010 | Gonzales et al. ............. 320/104 |

(Continued)

FOREIGN PATENT DOCUMENTS

| CN | 2192091 Y | 3/1995 |
| CN | 10123211 A | 7/2008 |

(Continued)

*Primary Examiner* — M'Baye Diao
(74) *Attorney, Agent, or Firm* — Leydig, Voit & Mayer, Ltd.

(57) ABSTRACT

An accumulator control device includes a first electrical connection configured to connect the accumulator control device to a local accumulator. A second electrical connection is connected to the first electrical connection and configured to connect to a remote auxiliary electrical power supply device. A control unit is configured to measure at least one of a parameter of the accumulator and an environmental parameter and to transmit at least one of the at least one measured parameter and a value calculated using the at least one measured parameter to the remote auxiliary electrical power supply device via a communication interface.

18 Claims, 5 Drawing Sheets

(56) References Cited

U.S. PATENT DOCUMENTS

| | | | |
|---|---|---|---|
| 8,103,892 B2 * | 1/2012 | Krajcovic | 713/323 |
| 2002/0186576 A1 * | 12/2002 | Kanouda et al. | 363/125 |
| 2005/0121979 A1 | 6/2005 | Matsumoto et al. | |
| 2007/0164707 A1 | 7/2007 | Suzuki et al. | |
| 2009/0206841 A1 * | 8/2009 | Weng | 324/426 |
| 2009/0273317 A1 | 11/2009 | Fan et al. | |
| 2010/0072975 A1 | 3/2010 | Hori | |
| 2011/0313613 A1 * | 12/2011 | Kawahara et al. | 701/29 |

FOREIGN PATENT DOCUMENTS

| | | |
|---|---|---|
| CN | 101316048 A | 12/2008 |
| CN | 101359841 A | 2/2009 |
| DE | 19834740 A1 | 2/2000 |
| DE | 29913613 U1 | 9/2000 |
| JP | H06189461 A | 7/1994 |
| JP | H08138749 A | 5/1996 |
| JP | 2001157380 A | 6/2001 |
| JP | 2001169465 A | 6/2001 |
| JP | 2001327092 A | 11/2001 |
| JP | 2002101569 A | 4/2002 |
| JP | 2002152993 A | 5/2002 |
| JP | 2002165371 A | 6/2002 |
| JP | 2003164075 A | 6/2003 |
| JP | 2005176461 A | 6/2005 |
| JP | 2007020273 A | 1/2007 |
| JP | 2009112180 A | 5/2009 |
| JP | 2010081673 A | 4/2010 |
| WO | 2008011760 A1 | 1/2008 |

\* cited by examiner

US 8,742,762 B2

ACCUMULATOR CONTROL DEVICE AND METHOD AND SYSTEM FOR AUXILIARY ELECTRICAL POWER SUPPLY

CROSS REFERENCE TO PRIOR APPLICATION

Priority is claimed to German Application No. DE 10 2010 048 188.2, filed Oct. 13, 2010, the entire disclosure of which is hereby incorporated by reference herein.

FIELD

The present invention generally relates to accumulator-operated systems for uninterruptible electrical power supply.

BACKGROUND

In many electrical installations, systems for uninterruptible electrical power supply (UPS) are used to ensure the operation of the electrical installations regardless of malfunctions in the energy supply network. A UPS is used to provide an auxiliary energy supply in the event of a malfunction of the normal energy supply. UPS is therefore also referred to below using the term "auxiliary electrical power supply".

For auxiliary electrical power supply, accumulators are typically used which are connected to an auxiliary electrical power supply device and alternatively supply a load which is connected to the auxiliary electrical power supply with electrical energy. An accumulator is a store for electrical energy, typically based on an electrochemical system which comprises one or more secondary cells which can be connected in series in order to increase the overall voltage or which can be connected in parallel in order to increase the capacity. The term "battery" is used below to refer to rechargeable batteries and is consequently used synonymously with accumulators.

During normal operation of the energy distribution network, electrical energy is supplied by the auxiliary electrical power supply device both to the connected load and to the battery. In the event of a malfunction in the energy supply network, the battery begins to discharge towards the load whose electrical energy supply is consequently not interrupted. When the energy distribution network returns to its normal operation, a supply of electrical energy is again provided both to the load and to the battery.

In installations with uninterruptible power supplies (UPS) with high expectations with regard to availability, the battery of the UPS is the element which decisively determines the possible duration of the battery operation, i.e., the possible buffer time and the service life of the installation and consequently the availability.

The battery management of a UPS therefore assumes great significance. A battery which is handled correctly in accordance with its type substantially increases the availability of the installation. A significant element of the battery management is the charging unit which can contribute significantly to maintaining the quality of the battery.

In order to be able to make best use of the capacity of a battery, the end-of-charge voltage is set to the highest possible level. A large amount of energy is thus stored in the battery. On the other hand, in order to maximise the service life of a battery, a somewhat smaller end-of-charge voltage can be used. In this manner, however, the capacity of the battery is not quite fully exploited in favour of the longer service life.

Therefore, the relationship between the service life of the battery and the possible buffer time can be established with a precisely defined end-of-charge voltage. The necessary end-of-charge voltage changes with the temperature of the battery. A UPS which takes into consideration the battery temperature during charging preserves the battery and maximises the service life of the battery and the possible buffer time.

DE 198 34 740 A1 describes a battery which has an integrated monitoring device in order to achieve a long service life and a good current discharge capacity, with various operating states of the battery being detected, stored and compared with stored values by means of sensors and indications regarding the charging state and the general technical state of the battery being derived therefrom.

In industrial UPSs, the auxiliary electrical power supply device which contains the electronic system of the UPS is typically located in a housing which is mounted, for example, on a top-hat rail, but the battery may be mounted remotely at a different location. Values for the battery voltage measured by the auxiliary electrical power supply device deviate from the actual battery voltage owing to the voltage drop on the line between the battery and the UPS. A temperature which is measured by the auxiliary electrical power supply device, for example, by means of a sensor arranged in the electronic system, may also deviate from the actual battery temperature.

Those deviations typically cannot be corrected by the auxiliary electrical power supply device so that the battery is not optimally charged.

SUMMARY

In an embodiment, the present invention provides an accumulator control device. A first electrical connection is configured to connect the accumulator control device to a local accumulator. A second electrical connection is connected to the first electrical connection and is configured to connect to a remote auxiliary electrical power supply device. A control unit is configured to measure at least one of a parameter of the accumulator and an environmental parameter and to transmit at least one of the at least one measured parameter and a value calculated using the at least one measured parameter to the remote auxiliary electrical power supply device via a communication interface.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
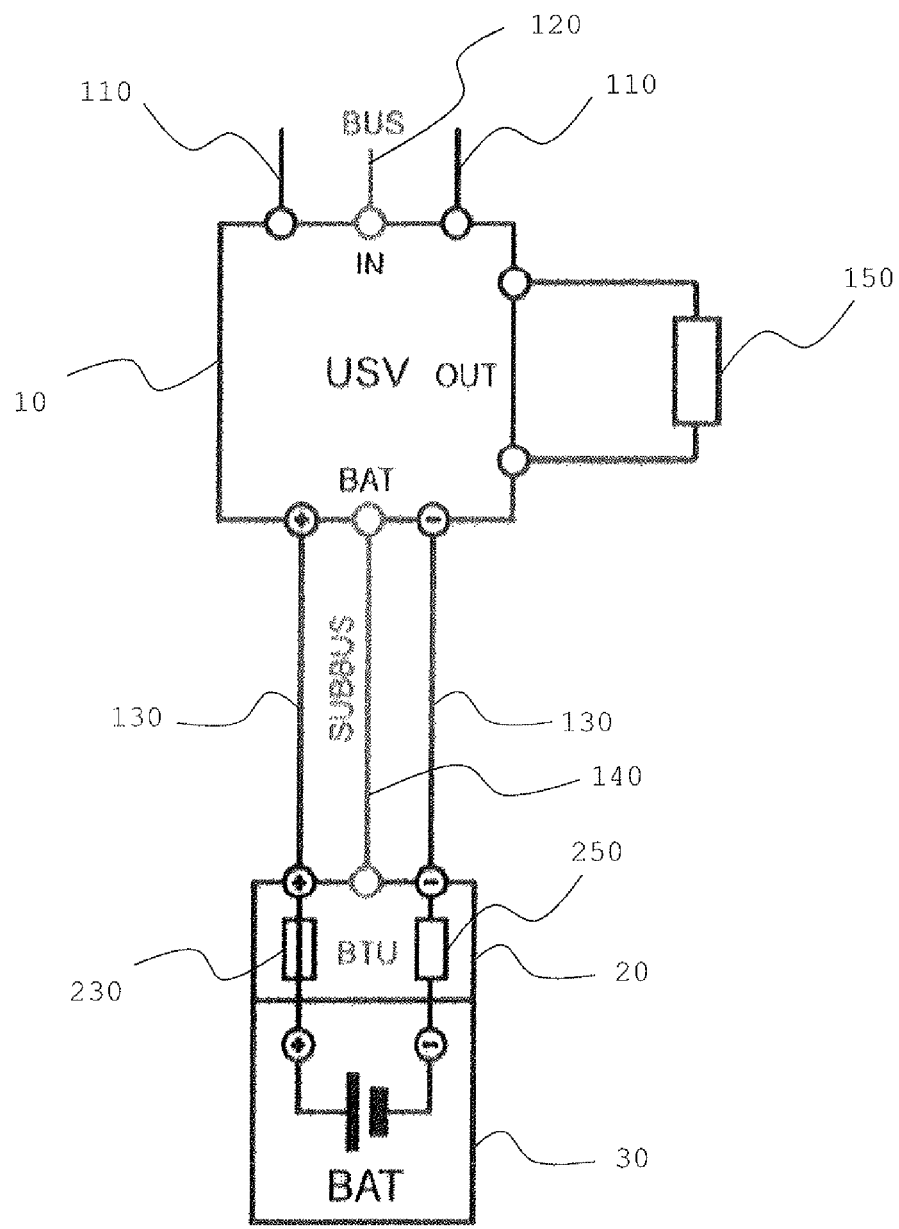
FIG. 1 schematically illustrates the basic construction of a preferred embodiment of a system for auxiliary electrical power supply according to the invention, FIG. 2 schematically illustrates a preferred embodiment of a system for the auxiliary electrical power supply according to the invention which comprises a plurality of accumulators, FIG. 3 schematically illustrates a preferred embodiment of an accumulator control device according to the invention with a connected accumulator and internal temperature sensor, FIG. 4 schematically illustrates a preferred embodiment of an accumulator control device according to the invention with a connected accumulator, a temperature sensor being arranged on the accumulator, FIG. 5 schematically illustrates the embodiment illustrated in FIG. 4 with a current sensor for determining the state of charge, FIG. 6 schematically illustrates the embodiment illustrated in FIG. 5 with a state of charge display, FIG. 7 schematically illustrates a preferred embodiment of an accumulator control device according to the invention with a connected accumulator and a measuring device for determining the internal resistance of the accumulator, and FIG. 8 schematically illustrates a preferred embodiment of an accumulator control device according to the invention with a connected lithium ion accumulator.

In an embodiment, the present invention provides a way in which the control of the charging and/or discharging of the accumulators used in an auxiliary electrical power supply can be improved, in particular when the auxiliary electrical power supply device and the accumulator are arranged remotely from each other.

In an embodiment, the invention provides for an accumulator control device which has a first electrical connection for connection to a local accumulator and a second electrical connection, which is connected to the first electrical connection, for connection to a remote auxiliary electrical power supply device. Consequently, the accumulator control device is preferably arranged in spatial proximity to a connected accumulator. Advantageously, the accumulator control device may be in the form of a ballast device for an accumulator or may be integrated in an accumulator housing.

In an embodiment, the accumulator control device has a control unit which is constructed to measure at least one parameter of an accumulator connected to the first electrical connection and/or an environmental parameter. In order to connect the control unit to the remote auxiliary electrical power supply device, a communication interface is provided, the control unit being constructed to transmit measured parameter values and/or values calculated from measured parameter values to the remote auxiliary electrical power supply device via the communication interface.

In an embodiment, the accumulator control device can advantageously form a common structural unit with a connected accumulator. An intelligent accumulator unit which is constructed for data communication with an auxiliary electrical power supply device is thereby advantageously provided.

In an embodiment, a notion of the invention involves setting out a way in which, in a UPS, particularly in an industrial environment, in which the auxiliary electrical power supply device and the accumulator are arranged remotely from each other, the voltage prevailing at the terminals of the accumulator and the prevailing temperature of the battery are determined at any time and provided to the auxiliary electrical power supply device in order to significantly increase the reliability and the useful life of the accumulator by those exact parameters being known.

To that end, in an embodiment, at least one measuring device is preferably provided which is connected to the control unit and which in particular is constructed to measure the accumulator voltage, the accumulator current, the internal resistance of the accumulator or to measure an environmental parameter, in particular the temperature.

In an embodiment, the control unit comprises an electronic circuit and advantageously a microcontroller. Since the accumulator control device is preferably mounted directly on the accumulator or is accommodated in the housing of the accumulator, the control unit records the desired measurement values directly at the battery. For instance, the accumulator voltage is advantageously measured directly at the terminals of the accumulator and the temperature is preferably measured either on the electronic system of the accumulator or with a sensor directly at the housing of the accumulator.

Accordingly, in an embodiment, the measuring device preferably comprises at least one sensor which is arranged in contact with an accumulator connected to the first electrical connection.

In a preferred embodiment, the accumulator control device further comprises a non-volatile memory, in which characteristic data of at least one connectable accumulator are stored. Those characteristic data preferably comprise characteristic data which serve to carry out charge balancing. To that end, the control unit is advantageously constructed to carry out charge balancing (State Of Charge, SOG) in dependence of the measured accumulator current and the stored characteristic data and thereby to monitor the state of charge of the accumulator. For example, a shunt resistor serves to measure electric current. The accumulator control device further advantageously comprises a device for displaying the state of charge so that operators can check the state of charge in situ. In order to keep the energy consumption of the state of charge display low, it is preferably able to be activated manually and becomes automatically deactivated again after a predetermined period of time after activation.

In order to protect the line between the accumulator and the auxiliary electrical power supply device against short-circuiting and overloading, the accumulator control device preferably comprises a line protection element which is connected between the first electrical connection and the second electrical connection.

In an embodiment, the data communication between the accumulator control device and the auxiliary electrical supply device is preferably carried out via a bus, in particular a serial bus, in particular constructed as an LIN (Local Interconnect Network) bus. Although the LIN bus is preferred for its simplicity, any other suitable bus system may also be used.

In an advantageous embodiment, the accumulator control device is constructed for operation with a connected lithium ion or lithium polymer accumulator with a plurality of accumulator cells. In that embodiment, the accumulator control device comprises a monitoring device for monitoring the cell voltages of the accumulator and a balancer device for balancing the cell voltages, the control unit being constructed to interrupt the connection between the first electrical connection and the second electrical connection if overcharging or exhaustive discharging of an accumulator cell is detected. The balancer device is constructed, for example, to convert the charge energy of the cells which have a higher voltage level into heat by a resistor during the charging operation of the accumulator in order thereby to balance the cell voltages.

In an embodiment, the accumulator control device typically has internally permanently stored, unique identification information, for example, in the form of a serial number.

In an embodiment, a system for auxiliary electrical power supply according to the invention comprises an auxiliary electrical power supply device and at least one accumulator which is connected to the auxiliary electrical power supply device remotely, an associated accumulator control device as described above being locally connected upstream of each accumulator.

If a plurality of accumulator control devices is connected to an auxiliary electrical power supply device, it is necessary to address the accumulator control devices. Such addressing may be carried out by means of the serial number. Since this typically has a large data length, however, alternatively a temporary communication ID is advantageously used which is preferably assigned by the auxiliary electrical power supply device in dependence of the serial number. To that end, the accumulator control device advantageously has a non-volatile memory for storing a temporary communication ID.

An embodiment of the present invention provides a method for controlling an above-described system for auxiliary electrical power supply providing for the charging and/or discharging of the at least one remotely connected accumulator to be controlled by the auxiliary electrical power supply device in dependence of at least one measured parameter and/or parameter calculated from measurement variables, and the at least one parameter being transmitted from the associated accumulator control device to the auxiliary electrical power supply device.

Depending on the application, the transmission of parameters is advantageously carried out on demand from the auxiliary electrical power supply device and/or at predetermined intervals of time. The parameters which are determined by an accumulator control device and transmitted to the auxiliary electrical power supply device comprise, for example, the accumulator voltage, accumulator current, internal resistance of the accumulator, state of charge of the accumulator and/or an environmental parameter, such as particularly the accumulator temperature.

For addressing purposes, the auxiliary electrical power supply device assigns a temporary communication ID to each accumulator control device connected, preferably in dependence of identification information which is permanently stored in the respective accumulator control device.

The invention is described in greater detail below by way of example by preferred embodiments and with reference to the appended drawings. The same reference numerals in the drawings indicate identical or similar parts.

FIG. 1 illustrates a system for auxiliary electrical power supply which comprises an auxiliary electrical power supply device 10 which serves to supply a connected load 150 with electrical energy and which is connected to that end to a mains network via lines 110. If the mains network malfunctions, electrical energy is directed from the rechargeable battery 30 to the load 150 and the battery 30 is discharged accordingly. If the mains network becomes available again, the load 150 is again supplied directly from the mains network and the battery 30 is recharged. The battery 30 is charged with an end-of-charge voltage which is controlled by the auxiliary electrical power supply device 10 and which is preferably adjusted in dependence of the battery type, the battery voltage and the battery temperature.

The parameters necessary for an optimum charging operation are transmitted via a bus 140 to the auxiliary electrical power supply device 10 from an accumulator control device 20 which is connected upstream of the battery 30, the accumulator control device 20 having to that end a microcontroller which controls the measurement, evaluation and transmission of data.

The battery 30 is connected to the auxiliary electrical power supply device 10 via two current-carrying lines 130 which extend through the accumulator control device 20. The data communication via the bus 140 is carried out via a third line. That line does not place high demands on the capacity for carrying current.

The power lines 130 are protected by a line protection element 230 arranged in the accumulator control device 20. In the embodiment illustrated in FIG. 1, a shunt resistor 250 for measuring current is further provided. The accumulator control device 20 preferably comprises a control unit 210 which is not illustrated in FIG. 1 and which has a microcontroller for device control and additional or different electronic components. The internal structure of the accumulator control device 20 is illustrated in detail in FIGS. 3 to 8 for different preferred embodiments 20a to 20f.

The auxiliary electrical power supply device 10 may advantageously be connected to a higher-level control device via a bus 120.

The accumulator control device 20 contains constant data stored in a non-volatile manner, such as battery type, nominal voltage, nominal capacity, revision of hardware, revision of firmware, type of charging method, type of charge retention, charging current, end-of-charge voltage, end-of-discharge voltage, temperature coefficient of the end-of-charge voltage, production date of the battery module, serial number of the battery module, communication address.

It is possible to operate one or more batteries 30 with an associated control device 20 together with an auxiliary electrical power supply device 10. Consequently, the buffer time can be scaled by the number of battery modules.

So that the control device 20 does not constitute a load on a storing battery 30, the microcontroller advantageously changes after a time of, for example, two minutes, during which no data have been received, to an operating mode in which only minimal energy is consumed. Data traffic being resumed on the communication channel wakes the microcontroller.

Figure 2:
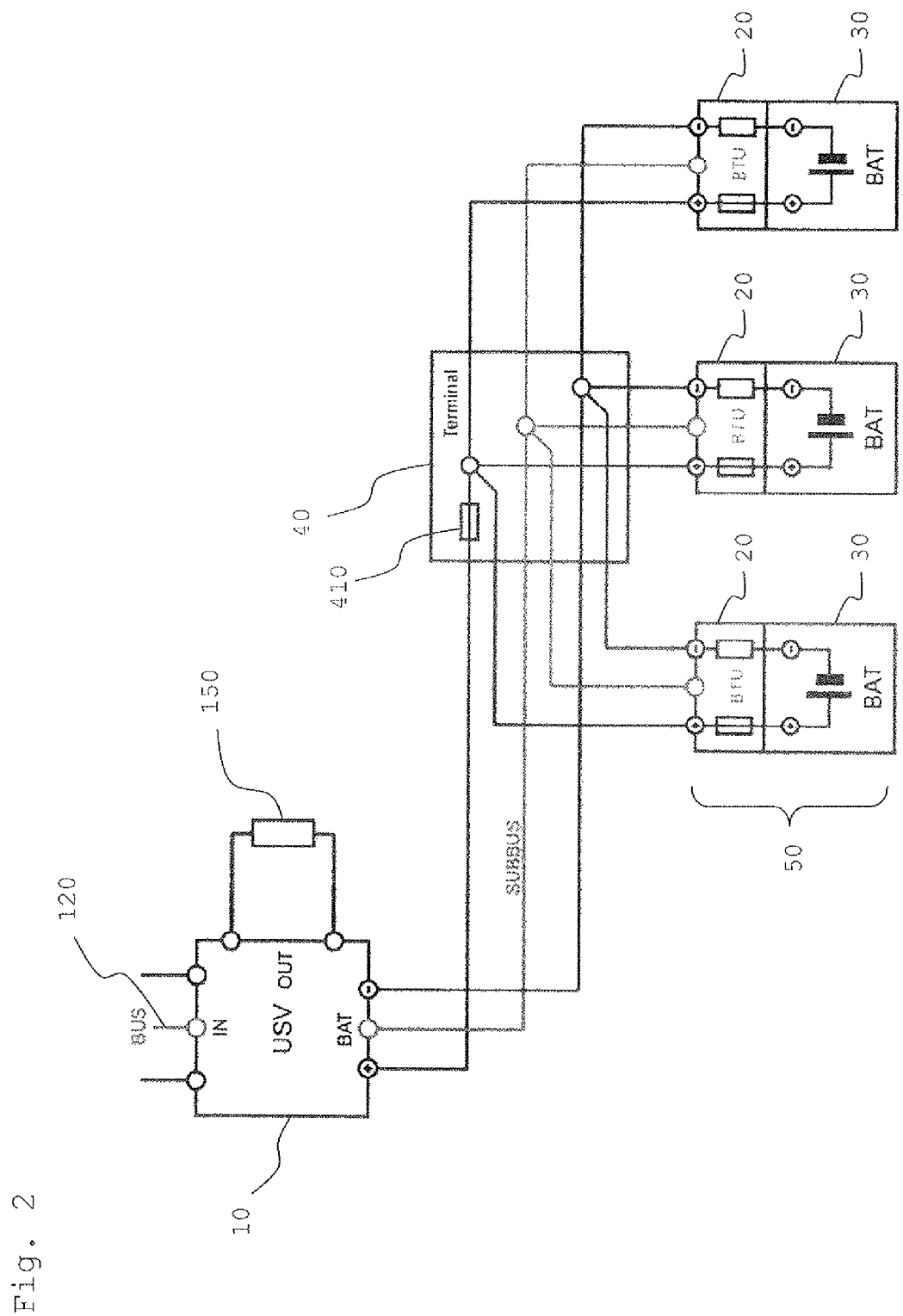

FIG. 2 shows a preferred embodiment, in which a plurality of batteries 30 are connected to the auxiliary electrical power supply device 10. In the embodiment illustrated, the batteries 30 are first connected to a terminal block (terminal) 40. The lines between the batteries and the terminal are protected against overloading by fuses in the control devices 20 connected upstream of the batteries 30. The lines between the terminal 40 and the auxiliary electrical power supply device 10 are protected by a separate fuse 410. The data lines of all the control devices 20 are simply connected to each other in the terminal 40 and are directed to the auxiliary electrical power supply device 10.

It is thereby possible to connect a plurality of "intelligent" battery units 50, each comprising a battery 30 and an associated control device 20, to an auxiliary electrical power supply device 10. In order to be able to communicate separately with each battery unit 50, the respective control device (Battery Terminal Unit, BTU) 20 must be able to be uniquely addressed. For example, a unique serial number of each BTU 20 may be used for that purpose. However, since this is typically very long and consequently would unnecessarily increase the message traffic, the auxiliary electrical power supply device 10 preferably assigns to each BTU 20 a unique communication address on the basis of the serial number thereof and transmits it to the respective BTU 20 which stores it in a non-volatile memory.

A preferred variant of this assignment comprises the following steps:

1. By broadcast message, all the communication addresses of the connected BTUs 20 are deleted or overwritten with an invalid communication address.

2. By broadcast message, the auxiliary electrical power supply device 10 enquires about participants which do not yet have a communication address.

3. The BTUs 20 which do not have a valid communication address reply after a random waiting time which has a value, for example, of between 100 ms and 1000 ms. Before a BTU 20 replies, it checks whether the communication channel is free. The reply of the BTU 20 contains the unique serial number of the BTU 20.

4. The auxiliary electrical power supply device 10 communicates a communication address to each BTU 20 in relation to its serial number. This is stored in the BTU 20 in a non-volatile manner.

5. The auxiliary electrical power supply device 10 enquires about new participants until it does not receive any more replies and all the BTUs 20 are addressed.

Figure 3:
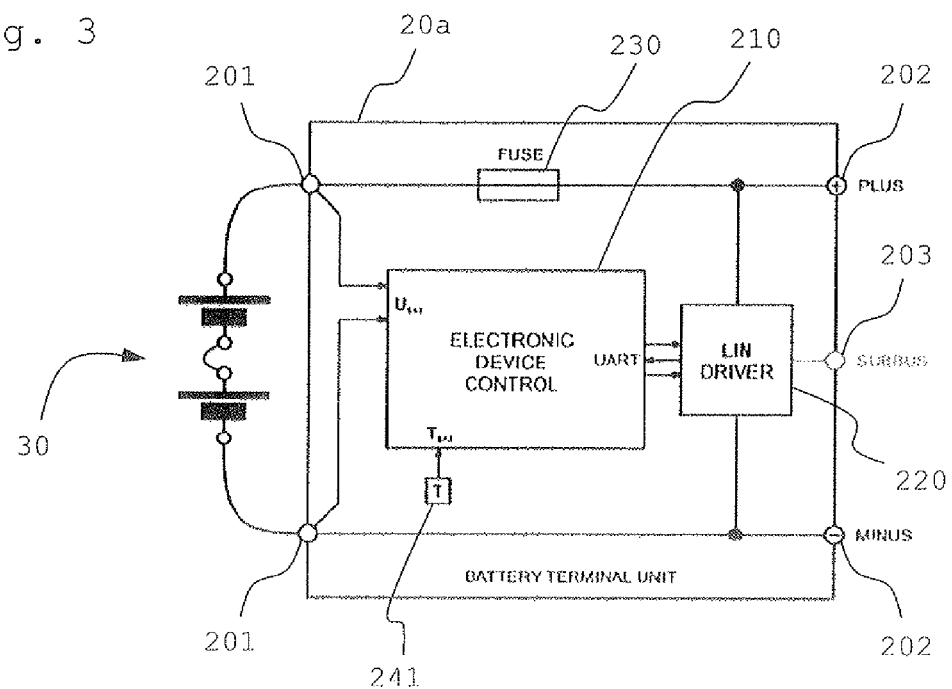

FIG. 3 shows a preferred embodiment of an accumulator control device 20a having an accumulator 30 connected to a first electrical connection 201. A second electrical connection 202 is provided for connection to an auxiliary electrical power supply device. In order to measure and evaluate parameters of the connected accumulator, a control unit 210 is provided for device control (Electronic Device Control) which comprises a microcontroller and which is constructed to communicate with an auxiliary electrical power supply device which is connected to an LIN bus by means of an LIN bus driver 220 via the LIN bus connected to the data connection 203. In the embodiment illustrated, the control unit 210 is constructed to measure the accumulator voltage and has corresponding signal inputs for that purpose. The control unit further has a temperature sensor 241 which is arranged on the printed circuit board thereof.

Advantageously, the electronic unit of the control unit is operated directly from the battery voltage which is, for example, 12 V or 24 V and the LIN bus driver makes the supply voltage available to the microcontroller, for example, 3.3 V or 5 V. A line protection element 230, for example, in the form of a fuse or MOSFET, protects the line between the battery 30 and the auxiliary electrical power supply device against short-circuits and overloads.

Figure 4:
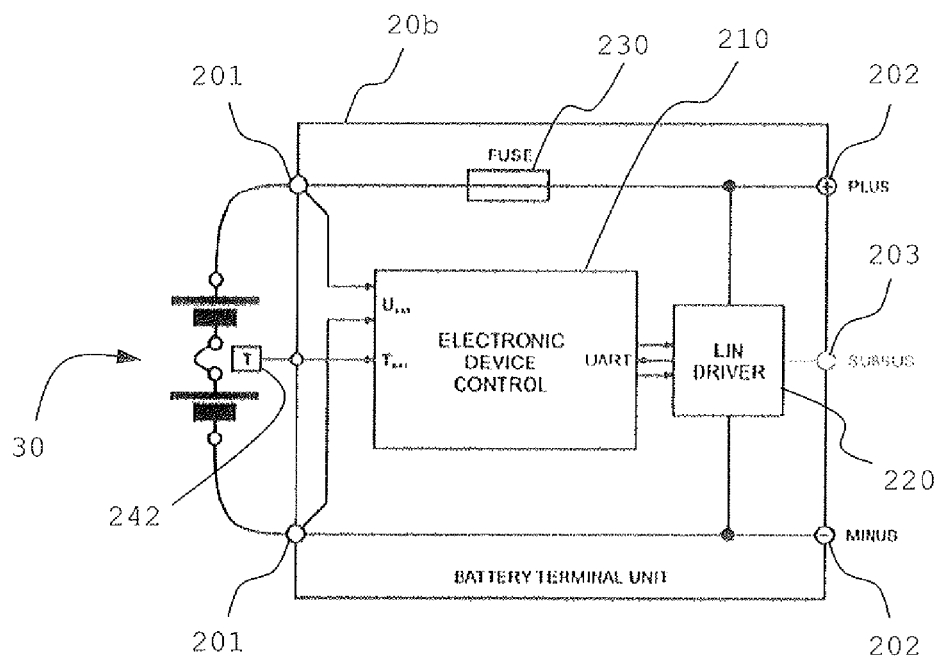

The embodiment of a control device 20b illustrated in FIG. 4 substantially corresponds to the embodiment shown in FIG. 3, but the temperature sensor 242 is not on the printed circuit board of the control unit 210 but is instead arranged on the battery housing and is connected to the control unit 210 by a line.

Figure 5:
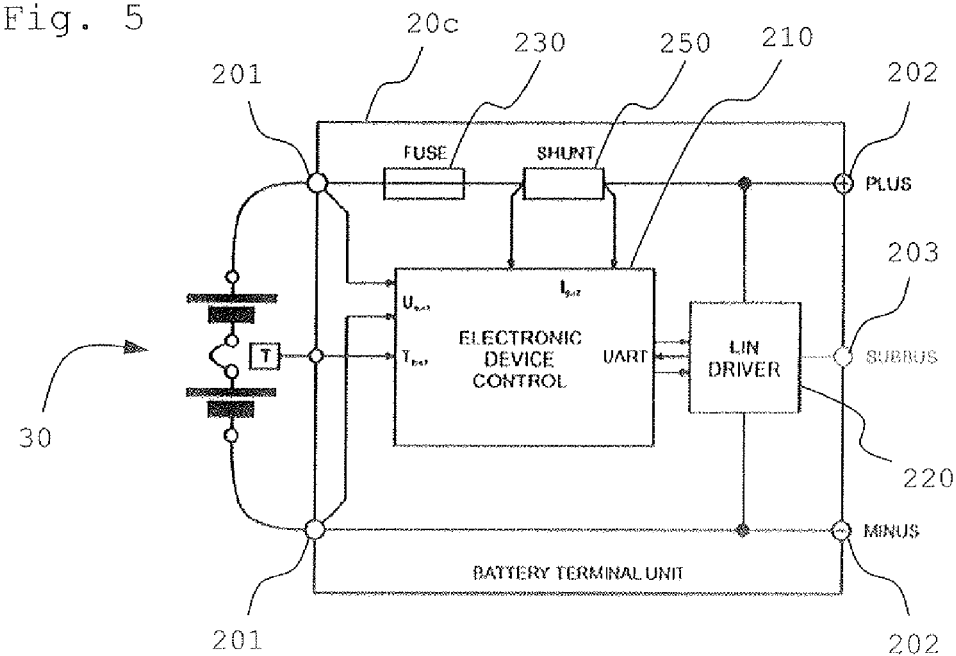

In the embodiment of a control device 20c illustrated in FIG. 5, a current sensor 250 is provided which is, for example, in the form of a shunt resistor and with which the battery current can be measured and evaluated. Consequently, charge balancing (State Of Charge, SOC) can be carried out directly at the battery. The characteristic data of the battery 30 necessary for this purpose are stored in the control unit 210 in a non-volatile manner.

Figure 6:
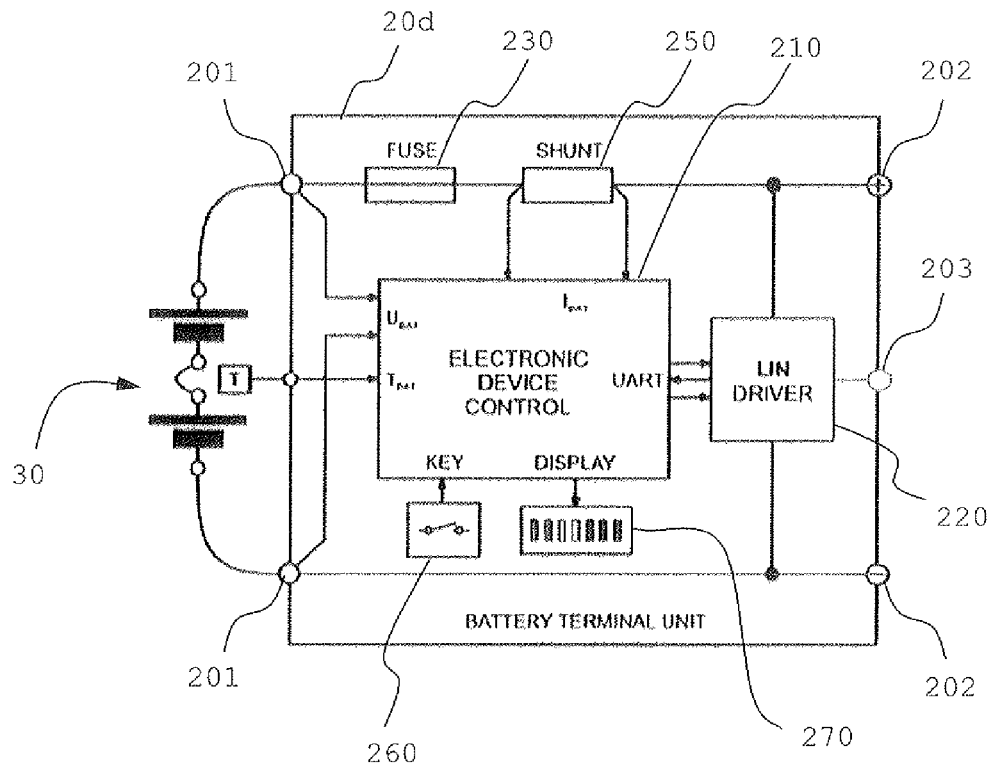

The embodiment of a control device 20d illustrated in FIG. 6 substantially corresponds to the embodiment shown in FIG. 5, a display 270 additionally being provided, for example, in the form of an LED bar graph, with which the prevailing charge state of the battery 30 can be illustrated. The display 270 can be started by a small push-button 260 and ends itself after a short time in order to conserve energy when the battery 30 is not connected.

Figure 7:
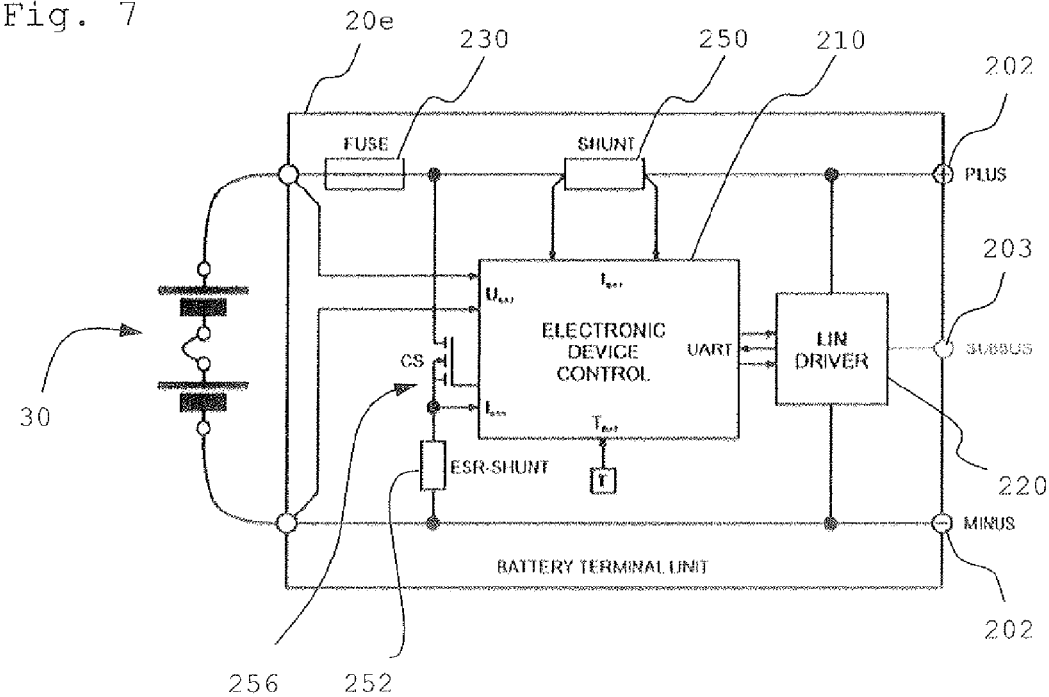

The embodiment of a control device 20e illustrated in FIG. 7 is constructed to measure the internal resistance (ESR) of the battery 30 in addition to the voltage, current and temperature. To that end, a switchable load 252 is provided, for example, as a MOSFET, in order to allow a battery current to flow, by means of which the internal resistance (ESR) of the battery 30 is measured. The quality of the battery (State Of Health, SOH, capacity loss) is thereby determined. If the power source 256 is switched on, the battery 30 is loaded with an additional current. The battery current is the total of the current of the shunt 250 and the current of the ESR shunt 252. The ESR of the battery can be calculated from the difference of the battery voltage and the difference of the battery current.

Figure 8:
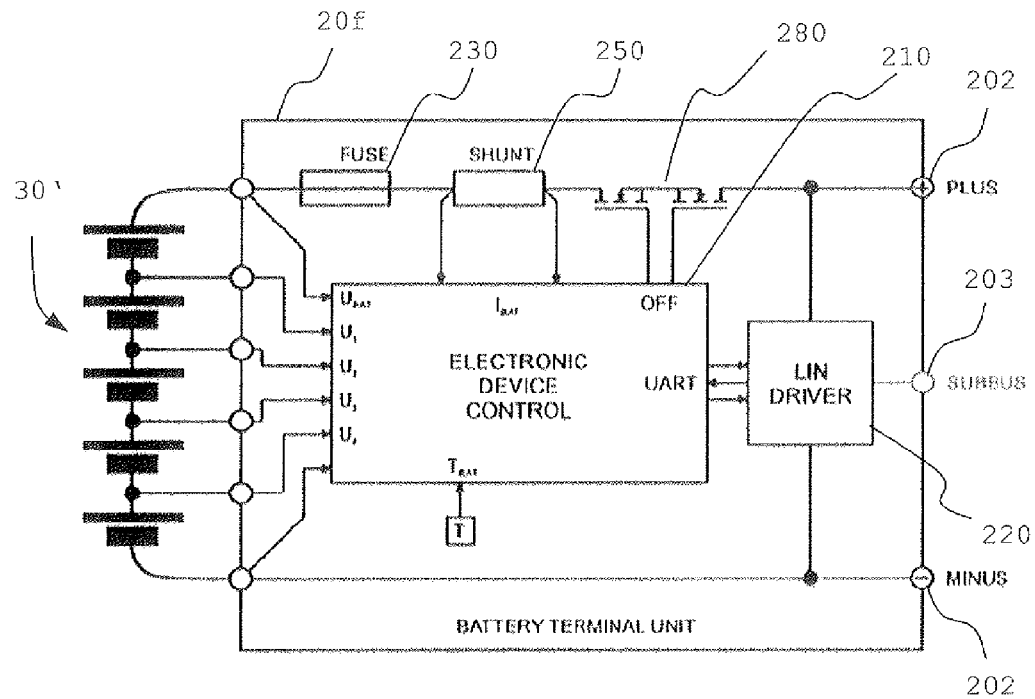

The embodiment of a control device 20f illustrated in FIG. 8 is constructed for using a lithium ion battery or lithium polymer battery 30'. In that embodiment, the control unit comprises signal inputs for measuring the cell voltages and a device for balancing the battery cells. Furthermore, the control unit 210 is constructed to separate the battery 30' from the auxiliary electrical power supply device by means of the device 280 in the event of overloading, exhaustive discharge or short-circuiting. Such an error state is preferably communicated to the auxiliary electrical power supply device 10 by means of bus communication.

While the invention has been described with reference to particular embodiments thereof, it will be understood by those having ordinary skill the art that various changes may be made therein without departing from the scope and spirit of the invention. Further, the present invention is not limited to the embodiments described herein; reference should be had to the appended claims.

What is claimed is:

1. An accumulator control device comprising:
a first electrical connection configured to connect the accumulator control device to a local accumulator;
a second electrical connection connected to the first electrical connection and configured to connect to a remote auxiliary electrical power supply device; and
a control unit configured to measure at least one of a parameter of the accumulator and an environmental parameter and to transmit at least one of the at least one measured parameter and a value calculated using the at least one measured parameter to the remote auxiliary electrical power supply device via a communication interface.

2. The accumulator control device as recited in claim 1, further comprising at least one measuring device connected to the control unit and configured to measure at least one of an accumulator voltage, an accumulator current, an internal resistance of the accumulator and the environmental parameter.

3. The accumulator control device as recited in claim 2, wherein the environmental parameter is a temperature.

4. The accumulator control device as recited in claim 2, wherein the measuring device includes at least one sensor disposed in contact with the accumulator.

5. The accumulator control device as recited in claim 1, further comprising a non-volatile memory configured to store characteristic data of at least one connectable accumulator, wherein the control unit is configured to monitor a state of charge of the at least one connectable accumulator using a measured accumulator current and the stored characteristic data.

6. The accumulator control device as recited in claim 5, further comprising a display device configured to display the state of charge.

7. The accumulator control device as recited in claim 1, further comprising a line protecting element connected between the first electrical connection and the second electrical connection.

8. The accumulator control device as recited in claim 1, wherein the communication interface includes a bus.

9. The accumulator control device as recited in claim 8, wherein the bus is a local interconnect network (LIN) bus.

10. The accumulator control device as recited in claim 1, wherein the accumulator control device forms a common structure unit with the accumulator.

11. The accumulator control device as recited in claim 1, further comprising:
a monitoring device configured to monitor cell voltages of the accumulator, the accumulator including one of a lithium ion accumulator and a lithium polymer accumulator having a plurality of accumulator cells; and a balancer device configured to balance the cell voltages, wherein the control unit is configured to interrupt a connection between the first electrical connection and the second electrical connection if one of an overcharging and an exhaustive discharging of one of the plurality of accumulator cells is detected.

12. The accumulator control device as recited in claim 1, further comprising a non-volatile memory configured to store a temporary communication ID and permanent identification information identifying the accumulator control device.

13. A system for auxiliary electrical power supply comprising:
   an auxiliary electrical power supply device;
   at least one accumulator connected remotely to the auxiliary electrical power supply device; and
   a respective accumulator control device disposed locally upstream of and associated with each of the at least one accumulator, the accumulator control device comprising:
      a first electrical connection configured to connect the accumulator control device to a respective accumulator;
      a second electrical connection connected to the first electrical connection and configured to connect to the auxiliary electrical power supply device; and
      a control unit configured to measure at least one of a parameter of the respective accumulator and an environmental parameter and to transmit at least one of the at least one measured parameter and a value calculated using the at least one measured parameter to the auxiliary electrical power supply device via a communication interface.

14. A method for controlling a system for auxiliary electrical power supply comprising:
   connecting an auxiliary electrical power supply device remotely to an accumulator and to an accumulator control device;
   transmitting at least one of a measured parameter and a parameter calculated from the measured parameter from the accumulator control device to the auxiliary electrical power supply device; and
   controlling, by the auxiliary power supply device, at least one of a charging and a discharging of the accumulator using the at least one transmitted parameter.

15. The method as recited in claim 14, wherein the transmitting is performed on demand from the auxiliary electrical power supply device.

16. The method as recited in claim 14, wherein the transmitting is performed at a predetermined interval of time.

17. The method as recited in claim 14, wherein the transmitted parameter includes at least one of an accumulator voltage, an accumulator current, an internal resistance of the accumulator, a state of charge of the accumulator and an environmental parameter.

18. The method as recited in claim 14, further comprising assigning, by the auxiliary electrical power supply device, a temporary communication ID to the accumulator control device based on permanent identification information stored in the accumulator control device.

\* \* \* \* \*